United States Patent [19]

Funatsu

[11] 4,375,645

[45] Mar. 1, 1983

[54] SEMICONDUCTOR DEVICE AND A METHOD OF PRODUCING THE SAME

[75] Inventor: Tsuneo Funatsu, Kawasaki, Japan

[73] Assignee: Fujitsu Limited, Kanagawa, Japan

[21] Appl. No.: 105,152

[22] Filed: Dec. 19, 1979

[30] Foreign Application Priority Data

Dec. 30, 1978 [JP] Japan .............................. 53-165804

[51] Int. Cl.³ ................... H01L 27/04; G11C 11/40; H03K 19/091
[52] U.S. Cl. ...................................... 357/50; 357/55; 357/92; 365/155; 365/156; 365/179; 365/181
[58] Field of Search ..................... 357/50, 55, 92, 54, 357/35; 365/155, 156, 179, 181

[56] References Cited

U.S. PATENT DOCUMENTS

| | | | |
|---|---|---|---|
| 3,978,515 | 8/1976 | Evans et al. | 357/50 |
| 4,231,056 | 10/1980 | Taylor | 357/50 |
| 4,231,057 | 10/1980 | Monna et al. | 357/55 |
| 4,255,207 | 3/1981 | Nicolay et al. | 357/55 |
| 4,269,636 | 5/1981 | Rivoli et al. | 357/50 |

OTHER PUBLICATIONS

DeClercq et al., Electronics Letters, vol. 12, No. 6, Mar. 18, 1976, pp. 150-151.
Hamilton & Howard, Basic IC Engineering, (McGraw-Hill, N.Y., 1975), pp. 6-7.

Primary Examiner—William D. Larkins
Attorney, Agent, or Firm—Staas & Halsey

[57] ABSTRACT

An I²L type semiconductor device having an elementary region which is isolated by V-shape grooves from the other portions of the device, said semiconductor device comprising an insulating layer coating covering the surface of the semiconductor body of the device, wherein an injector region is formed under said insulating layer and surrounded by thicker portions of said insulating layer, and base regions are formed under said insulating layer between said thicker portions of said insulating layer and said V-shape grooves.

15 Claims, 48 Drawing Figures

SEMICONDUCTOR DEVICE AND A METHOD OF PRODUCING THE SAME

BACKGROUND OF THE INVENTION

1. Field of the Invention

The present invention relates to an integrated injection logic (I²L) type semiconductor device and a method of producing the same. The I²L type semiconductor memory device in accordance with the present invention is used for a bipolar static random access memory (RAM) device, a logic circuit or the like.

2. Description of the Prior Art

Prior art memory cells of the I²L type memory devices are illustrated in FIGS. 1, 2, 3 and 4. FIGS. 1 and 2 illustrate an npn coupled type memory cell, while FIGS. 3 and 4 illustrate a pnp coupled type memory cell. FIGS. 1 and 3 illustrate the structure of the memory cells, while FIGS. 2 and 4 illustrate the circuit diagrams of the memory cells.

In FIG. 1, a p+ type injector region J, a contact portion $J_W$ of said p+ type injector region, p+ type base regions B, contact portions $B_0$ and $B_1$ of said p+ type base regions, n+ type collector regions C(n+), contact portions $C_{h0}$, $C_{h1}$, $C_{s0}$ and $C_{s1}$ of said n+ type collector regions, writing-in or reading-out lines $D_0$ and $D_1$, and a word line W are illustrated. An opposite word line W- connected to the semiconductor body is not shown in FIG. 1. As illustrated in FIGS. 1 and 2, the PNP type transistors $Q_2$ and $Q_3$ are constituted by lateral bipolar transistors, each of which transistors comprises a, p type injector region J as an emitter, an n type region $N_B$ as a base and p type region B as collectors. The NPN type transistors $Q_0$ and $Q_1$ are constituted by vertical bipolar transistors, each of which transistors comprises an n type region C(n+) as a collector, a p type base region B as a base and an n type region $N_B$, which is located under the base region B, as an emitter. Thus, both the PNP type transistors $Q_2$ and $Q_3$ and the NPN type transistors $Q_0$ and $Q_1$ have the n type region $N_B$ as a common connecting body.

In FIG. 3, a p+ type injector region J, a contact portion $J_w$ of said p+ type injector region, p+ type base regions B, contact portions $B_0$ and $B_1$ of said p+ type base regions B, n+ type collector regions C(n+), contact portions $C_{h0}$ and $C_{h1}$ of said n+ type collector regions, contact portions $C'_{s0}$ and $C'_{s1}$ of emitter regions E(p+) of a lateral pnp transistor for detection, writing-in or reading-out lines $D_0$ and $D_1$, and a word line W are illustrated. An opposite word line W− is connected to the semiconductor body and is not shown in FIG. 3. As illustrated in FIGS. 3 and 4, the PNP type illustrated. As illustrated in FIGS. 3 and 4, the PNP type transistors $Q_2$ and $Q_3$ are constituted by lateral bipolar transistors, each of which transistors comprises a p type injector region J as a common emitter, an n region $N_B$ as a common base and p type regions B as collectors. The NPN type transistors $Q_0$ and $Q_1$ are constituted by vertical bipolar transistors, each of which transistors comprises an n type region C(n+) as a collector, a p type base region B as a base and the n type region $N_B$, which is located under the base region B, as an emitter. The PNP type transistors $Q_4$ and $Q_5$ are constituted by lateral bipolar transistors, each of which transistors comprises a p type region B as a collector, an n type region $N_{BD}$ connected to the n type region B as a base and a p+ type region E(P+) as an emitter. Thus, all of the PNP type transistors $Q_2$ and $Q_3$, NPN type transistors $Q_0$ and $Q_1$ and the PNP type transistors $Q_4$ and $Q_5$ have the n type regions $N_B$ and $N_{BD}$ as a common connecting body.

In FIGS. 1, 2, 3 and 4, $B_0$, $C_{h0}$, $C_{s0}$ and $D_0$ are related to the "0" (or "1") side transistor $Q_0$, while $B_1$, $C_{h1}$, $C_{s1}$ and $D_1$ are related to the "1" (or "0") side transistor $Q_1$.

In the memory cell of FIGS. 1 and 3, since the structures of the transistors $Q_0$ and $Q_1$ of the flip-flop circuit are symmetrical, the operations of the transistors $Q_0$ and $Q_1$ of the flip-flop circuit are symmetrical. Accordingly the currents which energize the transistors $Q_0$ and $Q_1$ are caused to be precisely symmetrical, and no asymmetry in the operations of the writing-in and the reading-out of information occurs. Also, since the currents delivered from the injector region J are uniform in every direction, high injection efficiency is obtained and, accordingly, excellent operating characteristics of the flip-flop circuit are obtained.

However, in the manufacture of the memory cell of FIGS. 1 and 3 it is necessary to use a masking pattern which defines an opening in the insulation layer over the p+ type injector region through which an electrical connection between the p+ type injector an the conductor is formed. In order to avoid misalignment of the mask, it is necessary to make the size of the device large. Also, conductors for internal connections of the device occupy a predetermined volume of space in the device.

Therefore, in the prior art, it was difficult to reduce the size of an I²L type memory device.

The prior art I²L memory cell is described in, for example, "Injection-coupled Memory: A High-Density Static Bipolar Memory" by S. K. Wiedmann, IEEE Journal of Solid-state Circuits, Vol. SC-8, No. 5, October 1973, and in the Japanese patent application No. 51-71855 entitled "A Semiconductor Memory Device".

SUMMARY OF THE INVENTION

The present invention has been proposed in order to solve the problems in the prior art semiconductor memory devices set forth above.

It is the principal object of the present invention to reduce the size of an I²L type memory device and increase the degree of integration of an integrated circuit for an I²L type memory device.

In accordance with the present invention, a semiconductor memory device is provided having an elementary region which is isolated by V-shape grooves from the other portions of the device, said semiconductor memory device comprising an insulation coating covering the surface of the semiconductor body of the device, predetermined portions of said insulation coating being thicker and said thicker insulating layers surrounding the central portion of said elementary region, an injector region formed under said insulating layer and surrounded by said thicker portions of said insulating layer, and base regions formed under said insulating layer between said thicker portions of said insulating layer and said V-shape grooves.

BRIEF DESCRIPTION OF THE DRAWINGS

FIG. 4 illustrates the circuit diagram of the device of FIG. 3, FIGS. 5A through 15D illustrate a process of manufacturing I²L type memory cells in accordance with an embodiment of the present invention, in which

DETAILED DESCRIPTION OF THE PREFERRED EMBODIMENTS

Figure 1:
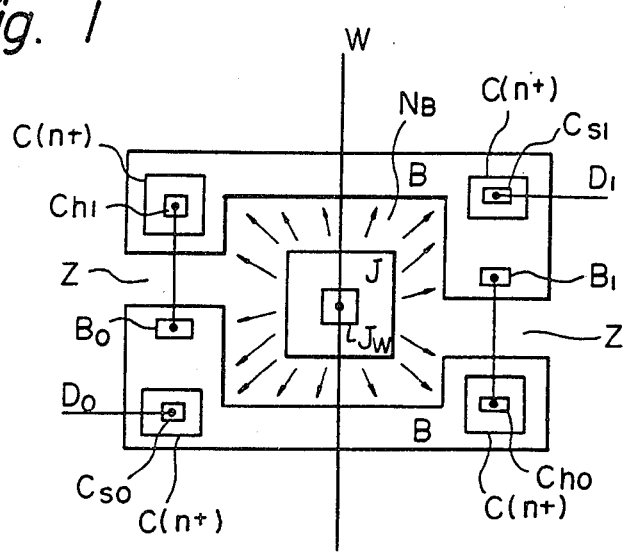
FIG. 1 illustrates the structure of a prior art I²L type memory cell of an npn coupled type.

A process of manufacturing an I²L type semiconductor memory device in accordance with an embodiment of the present invention will now be described with reference to FIGS. 5A through 15D.

As illustrated in FIGS. 5A, 5B, 5C and 5D, an n+ type layer 2 is formed in a p type silicon (Si) semiconductor substrate 1 having the Miller indices of (100) by introducing n type impurities by means of a gaseous diffusion process or an ion implantation process.

Then, an n type layer 3 of approximately 2 $\mu$m is formed by means of, for example, the gaseous epitaxial growth process. The n type layer 3 has also the Miller indices of (100).

Then, a silicon dioxide ($SiO_2$) layer 4 with a thickness of approximately 1,400 Å is formed by means of for example, thermal oxidation process.

Then, a silicon nitride ($Si_3N_4$) layer 5 with a thickness of approximately 2,500 Å is formed by means of, for example, the chemical vapor deposition process. This silicon nitride layer 5 acts as an anti-oxidation mask.

Then, a patterning of the silicon nitride layer 5 is effected by using, for example, the photolithographic process, so that a masking pattern is formed which covers the portion of the n type layer 3 where base regions 91, 92 and an injector region 10 (FIG. 10B) are to be formed.

As illustrated in FIGS. 6A, 6B, 6C and 6D, a photoresist layer 6 is applied to protect the portion of silicon dioxide layer 4 covering at least a portion of the surface of the n type region located between the base regions 91, 92 and the injector region 10, and a selective removal of the silicon dioxide layer 4 is effected by using the masking pattern of the silicon nitride layer 5 and the photoresist layer 6.

Figure 7A:
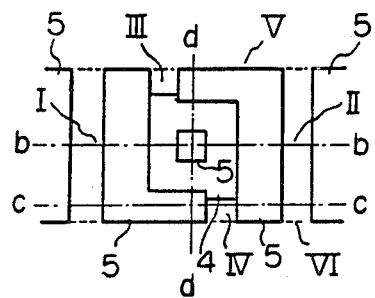
Figure 7B:
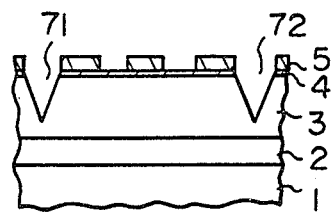
Figure 7C:
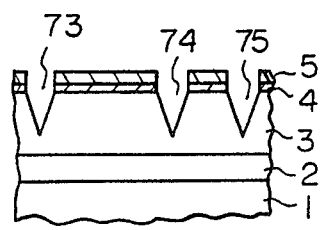
Figure 7D:
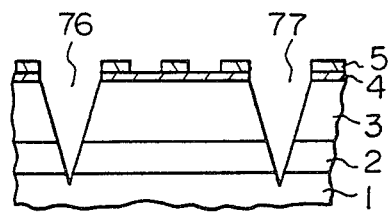

As illustrated in FIGS. 7A, 7B 7C and 7D, after removing the photoresist layer 6, an etching of the n type layer 3 is effected by using the masking pattern of the silicon nitride layer 5 and the silicon dioxide layer 4, so that V-shape grooves 71, 72, 73, 74, 75, 76 and 77 which define the boundary of elementary regions of the device are formed. In this etching process, an anisotropic etching solution, with which the rate of the etching is greater for the plane having the Miller indices of (100) than for the other planes, is used. For this anisotropic etching solution, a solution containing, for example, potassium hydroxide (KOH) as the main constituent is used. The depth of the V-shape grooves 71, 72, 73, 74 and 75 in the regions I, II, III and IV of FIG. 7A does not extend to the boundaries of where the n type layer 3 and the n+ type layer 2 meet, due to the selection of the width of the V-shape groove at the surface of the n type layer 3, as illustrated in FIGS. 7B and 7C. However, the depth of the V-shape grooves 76 and 77 in the regions V and VI of FIG. 7A extends through the n30 type layer 2 due to the selection of the width of the V-shape groove at the surface of the n-type layer 3, as illustrated in FIG. 7D.

Figure 8A:
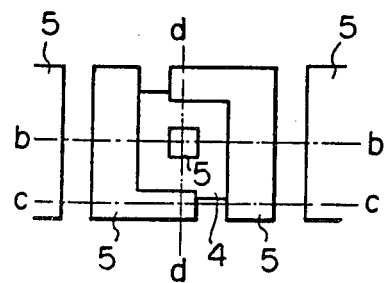
Figure 8B:
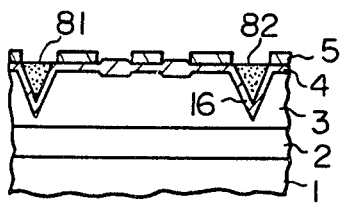
Figure 8C:
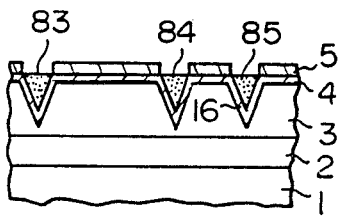
Figure 8D:
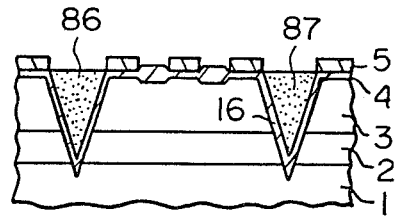

As illustrated in FIGS. 8A, 8B, 8C and 8D, a silicon dioxide layer 16 is formed on the inner surface the V-shape grooves 71, 72 73, 74, 75, 76 and 77 by means of, for example, a thermal oxidation process. The thickness of the silicon dioxide layer 16 is approximately 3,000 Å to 5,000 Å. At the same time, the thickness of the portions of the silicon dioxide layer 4 which are not covered by a silicon nitride layer and not occupied by V-shape grooves is increased. Then, a polycrystalline silicon layer is formed on the silicon dioxide layer and silicon nitride layer by means of, for example, chemical vaper deposition process, and then said polycrystalline silicon layer is polished chemically and mechanically by using a polishing solution containing potassium hydroxide and aluminum oxide ($Al_2O_3$) as the main constituents. This polishing is completed when the silicon nitride layer 5 reveals itself from said polycrystalline silicon layer which is being polished, so that the polycrystalline silicon layers 81, 82, 83, 84, 85, 86 and 87 are maintained only in the V-shape grooves 71, 72, 73, 74, 75, 76 and 77, as illustrated in FIGS. 8B, 8C and 8D.

Figure 9A:
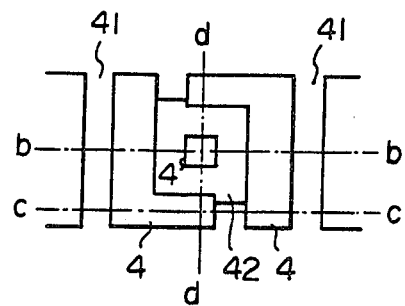
Figure 9B:
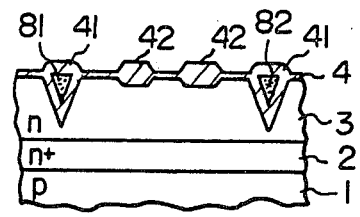
Figure 9C:
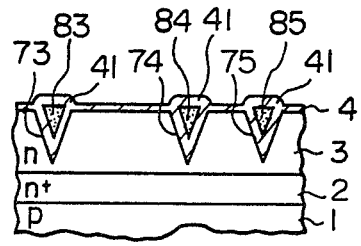
Figure 9D:
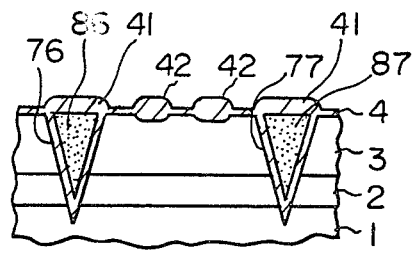

As illustrated in FIGS. 9A, 9B, 9C and 9D, silicon dioxide layers 41 are formed on the surfaces of the polycrystalline silicon layers 81, 82, 83, 84, 85, 86 and 87 and the thickness of the portions of the silicon dioxide layer 4 which are not covered by the silicon nitride layer 5 are enlarged by using the thermal oxidation process. The thicker portions 42 of the silicon dioxide layer 4 are illustrated in FIGS. 9B and 9D. The silicon dioxide layer 42 has a thickness of approximately 7,000 Å to 12,000 Å. Then, the silicon nitride layer 5 is removed.

As illustrated in FIGS. 10A, 10B, 10C and 10D, p type base regions 91 and 92 and a p type injector region 10 are formed by introducing, for example, boron (B) by means of, for example, the ion implantation process. It is also possible to form these p type base regions and a p type injector region below the thin portions of the silicon dioxide layer by applying, for example, the solid to solid diffusion process for a long duration.

Figure 10A:
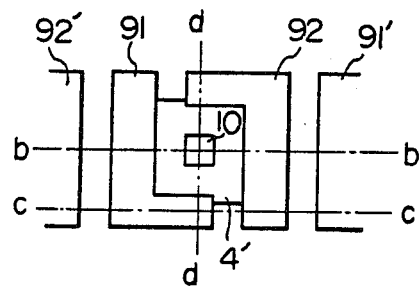
Figure 10B:
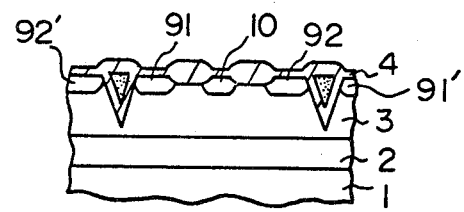
Figure 10C:
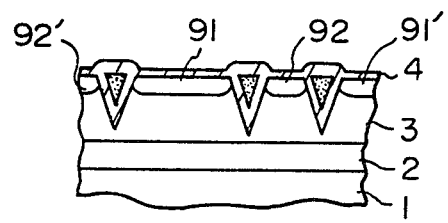
Figure 10D:
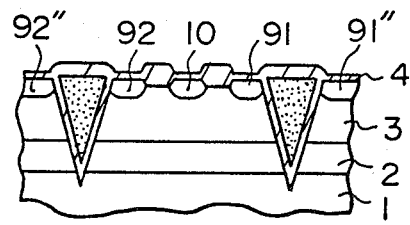
Figure 11A:
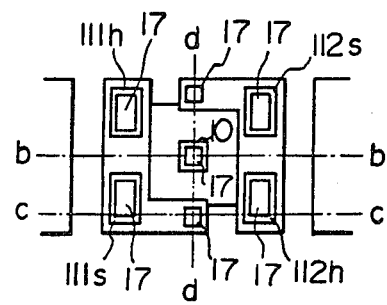
Figure 11B:
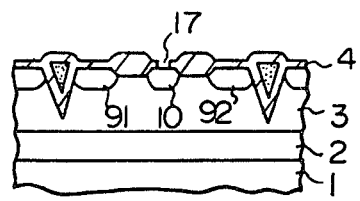
Figure 11C:
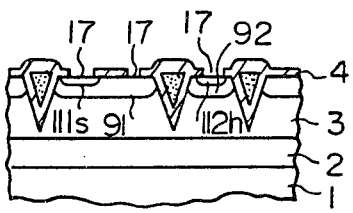
Figure 11D:
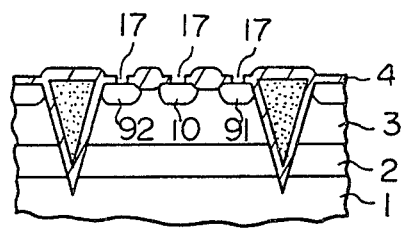
Figure 12A:
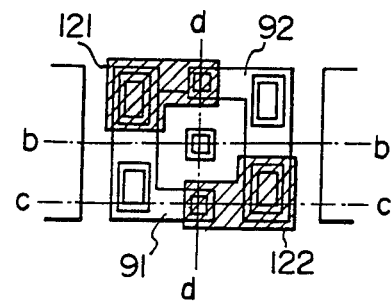
Figure 12B:
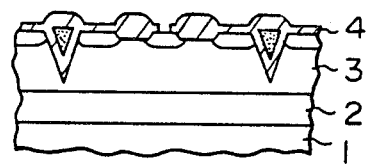
Figure 12C:
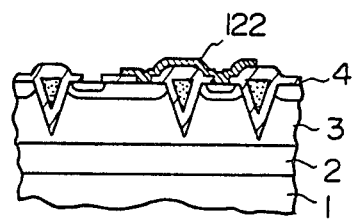
Figure 12D:
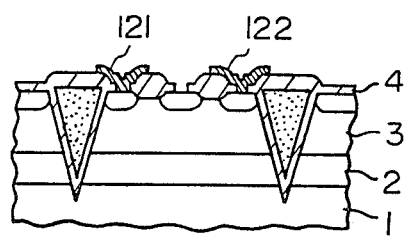
Figure 13A:
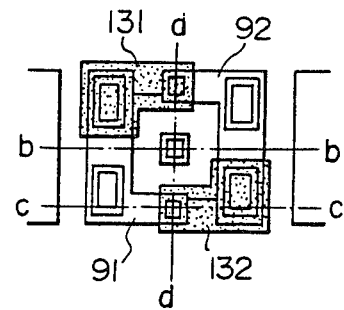
Figure 13B:
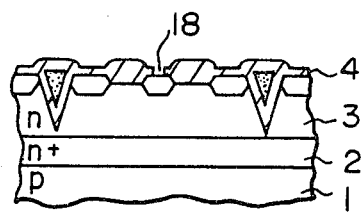
Figure 13C:
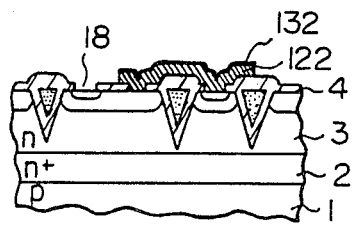
Figure 13D:
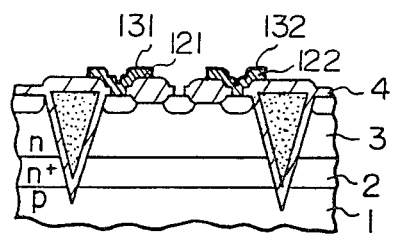
Figure 14A:
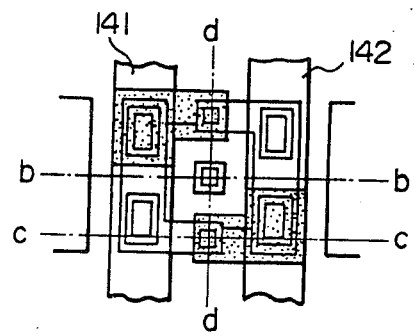
Figure 14B:
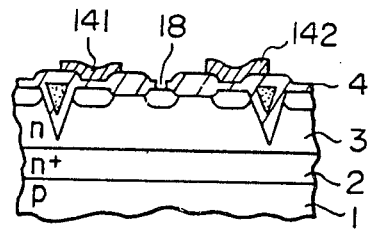
Figure 14C:
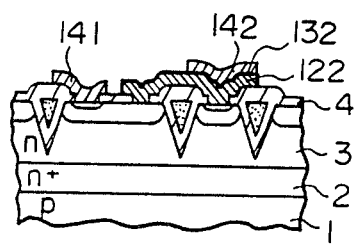
Figure 14D:
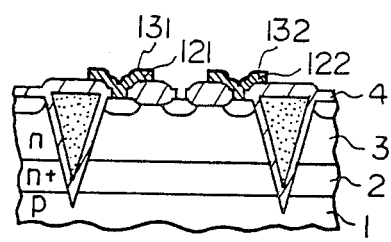
Figure 15A:
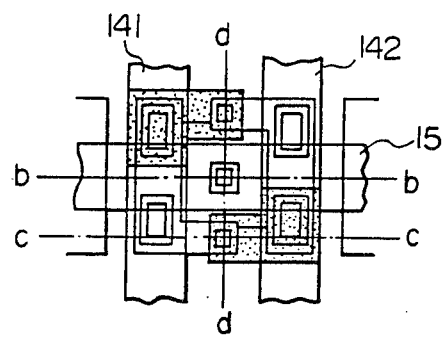
Figure 15B:
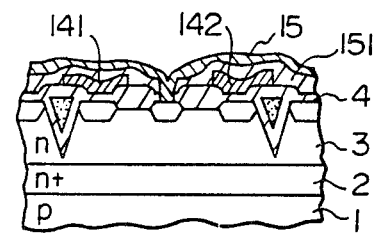
Figure 15C:
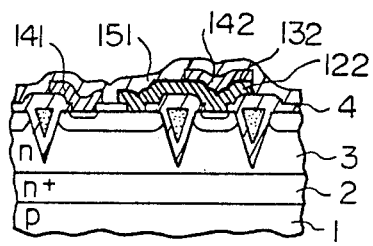
Figure 15D:
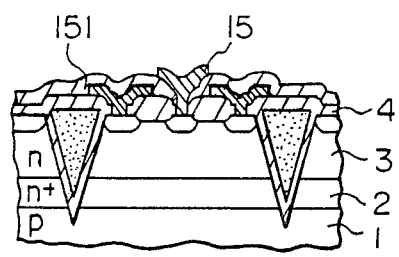

P type base regions 91', 92' of the adjacent memory cells on the same word line are illustrated in FIGS. 10A, 10B and 10C. Base regions 91'', 92'' of the memory cells on the adjacent word lines are illustrated in FIG. 10D.

As illustrated in FIGS. 11A, 11B, 11C and 11D, n type emitter regions $111_h$, $111_s$, $112_h$ and $112_s$ are formed in the base regions 91 and 92 by introducing n type impurities for example, arsenic (As) or phosphorus (P), by means of an ion implantation process or a gaseous diffusion process with a masking pattern. Said gaseous diffusion is effected through windows which are formed in the silicon dioxide layer 4 by means of a patterning process with a masking pattern. The emitter regions $111_h$ and $112_h$ constitute HOLD side emitters, while the emitter regions $111_s$ and $112_s$ constitute SELECT side emitters. Then windows 17 for providing conduction paths to electrodes are formed in the silicon dioxide layer 4 by means of the patterning process with the photolithogaphic process.

Figure 2:
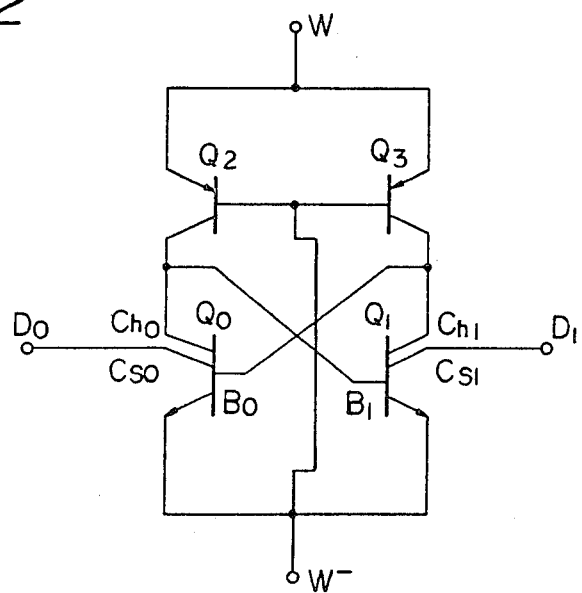
FIG. 2 illustrates the circuit diagram of the device of FIG. 1.
Figure 3:
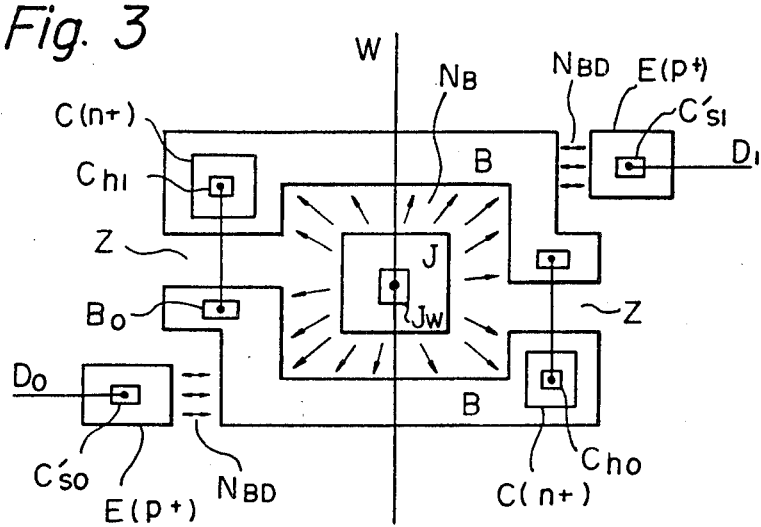
FIG. 3 illustrates the structure of a prior art I²L type memory cell of a pnp coupled type.
Figure 4:
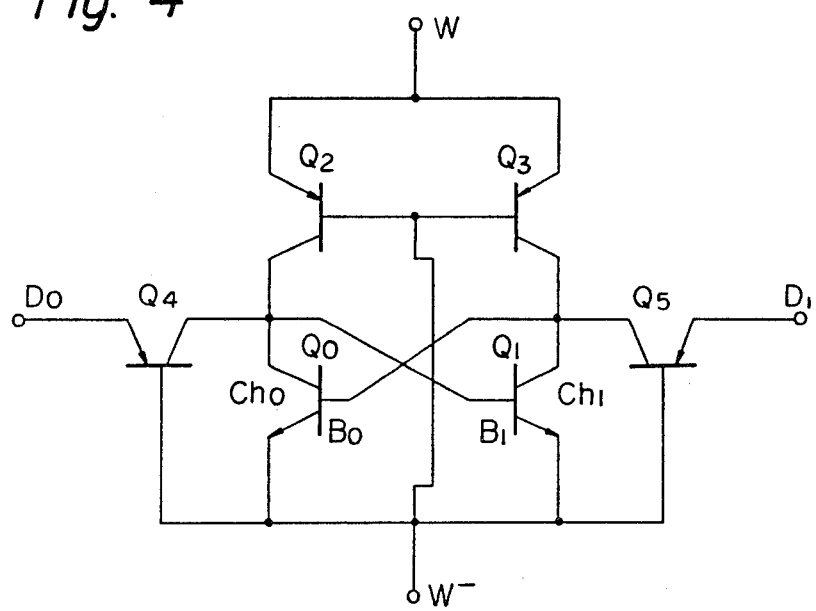
Figure 5A:
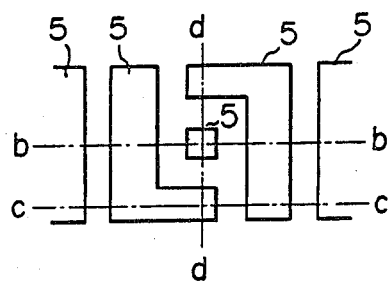
FIGS. 5A, 6A, 7A, 8A, 9A, 10A, 11A, 12A, 13A, 14A and 15A illustrate the plan views of the device in the steps of the manufacturing process.
Figure 5B:
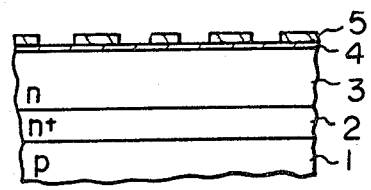
FIGS. 5B, 6B, 7B, 8B, 9B, 10B, 11B, 12B, 13B, 14B and 15B illustrate the cross-sectional views of the device taken along the lines b—b in FIGS. 5A through 15A, respectively.
Figure 5C:
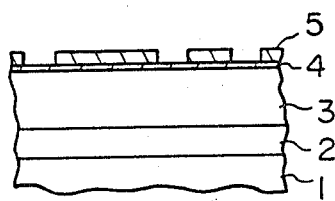
FIGS. 5C, 6C, 7C, 8C, 9C, 10C, 11C, 12C, 13C, 14C and 15C illustrate the cross-sectional views of the device taken along the lines c—c in FIGS. 5A through 15A, respectively.
Figure 5D:
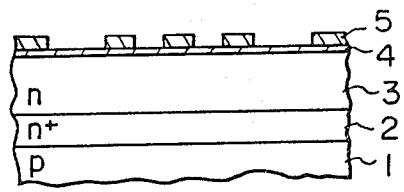
FIGS. 5D, 6D, 7D, 8D, 9D, 10D, 11D, 12D, 13D, 14D and 15D illustrate the cross-sectional views of the device taken along the lines d—d in FIGS. 5A through 15A, respectively.
Figure 6A:
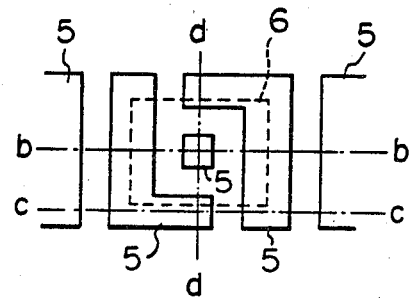
Figure 6B:
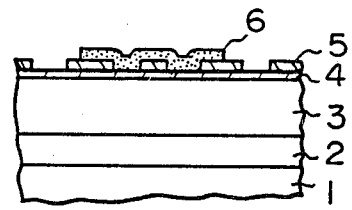
Figure 6C:
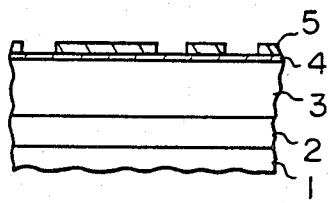
Figure 6D:
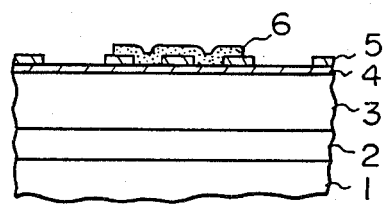

As illustrated in FIGS. 12A, 12B, 12C and 12D, an aluminum (Al) layer with a thickness of approximately 1,000 to 3,000 Å is deposited on the surface of the device by means of, for example, the vapor deposition process, and then electrode conductors 121 and 122 of a first wiring layer are formed by means of the patterning process with a photolithographic process applied to said aluminum layers. These electrode conductors 121 and 122 do not need to be exposed on the surface of the device. These electrode conductors 121 and 122 correspond to the cross coupling conductors connecting the bases of the transistors $Q_0$ and $Q_1$ to the collectors of the transistors $Q_2$ and $Q_3$, respectively, in the prior art devices of FIGS. 2 and 4.

As illustrated in FIGS. 13A, 13B, 13C and 13D, aluminum oxide ($Al_2O_3$) layers 131 and 132 are formed on the electrode conductors 121 and 122 by means of an anodic oxidation process in which, for example, a solution of ammonium borate is used with a voltage of 100 V. The aluminum oxide layer has a thickness of approximately 200 to 500 Å. Silicon dioxide layers, which were formed on the windows in which no conductors are filled, are removed from the portions 18 by means of, for example, the washing process.

As illustrated in FIGS. 14A, 14B, 14C and 14D, an aluminum layer with a thickness of approximately 8,000 to 12,000 Å is deposited on the surface of the device by means of, for example, a vapor deposition process, and then electrode conductors 141, 142, of a second wiring layer are formed by means of the patterning process with the photolithographic process applied to said aluminum layer. The electrode conductors 141 and 142 constitute digit lines connected to the SELECT side emitter regions $111_S$ and $112_S$. Electrode conductors 141 and 142 are arranged on the cross coupling conductors 121 and 122. The oxide layers 131 and 132 on the cross coupling conductors 121 and 122 prevent a short circuit between the cross coupling conductors 121 and 122 and the electrode conductors 141 and 142.

As illustrated in FIGS. 15A, 15B, 15C and 15D, an insulating layer 151 is formed to cover the electrode conductors and the exposed insulating layer. The insulating layer 151 of, for example, phosphosilicate glass is formed by, for example, a chemical vapor deposition process with thickness of approximately 8,000 to 10,000 Å. A window is formed in the insulating layer 151 corresponding to the position 18 by means of an ordinary photolithographical process. Then, an aluminum layer with a thickness of approximately 8,000 to 12,000 Å is deposited on the surface of the insulating layer 151 by means of, for example, a vapor deposition process. And then, an electrode conductor 15 of third wiring layers are formed by means of the patterning process with the photolithographic process applied to the aluminum layer. The electrode conductor 15 constitutes a word line. Sufficient widths and reduced resistivity are obtained in the above described structures of the wiring. Accordingly, the speed of the $I^2L$ memory device can be increased. A sequence of memory cells, which are located on the portion of the n+ type layer 2, defined between the deep V-shape grooves 76 and 77, is connected commonly to the n+ type layer acting as an opposite word line (W−).

A passivation is effected by coating the surface of the memory cell array with a layer of phosphosilicate glass and the like, though such a layer is not illustrated in the drawings.

The ordinary V-shape grooves 71, 72, 73, 74 and 75 prevent parasitic pnp effects which might occur between the adjacent base regions in a memory cell or between the adjacent memory cells housing the same opposite word line (W−) mentioned above.

It should be noted that the locations of the base regions 91 and 92 and the injector region 10 in the structure of FIGS. 15A, 15B, 15C and 15D have been determined by the patterning of the silicon nitride layer 5 in the structure of FIGS. 5A, 5B, 5C and 5D, because the locations of the V-shape grooves 71, 72, 73, 74, 75, 76 and 77 and the thicker portions 42 in the structure of FIGS. 9B, 9C and 9D have been determined by the patterning of the silicon nitride layer 5 in the structure of FIGS. 5A, 5B, 5C and 5D. Accordingly, in accordance with the process illustrated in FIGS. 5A through 15D, the injector region and the base regions are formed in the manner of so-called "self-alignment". This makes it possible to reduce the size of the device and increase the degree of integration of the integrated circuit of the device. Also, in accordance with the process illustrated in FIGS. 5A through 15D, the electrode conductors of the second wiring layer can be formed on the portion in which the electrode conductors of the first wiring layer are buried. This also makes it possible to increase the degree of integration of the integrated circuit of the device.

The above described explanations of an embodiment of the present invention mainly refer to the structure and the process of the production of an $I^2L$ memory cell. However, a control circuit such as an address decoder and the like for controlling said $I^2L$ memory cell can also be formed on the semiconductor body on which said $I^2L$ memory cell is formed. Circuits such as a bipolar transistor logic circuit, an $I^2L$ logic circuit and the like for forming said control circuit can have the above described V-shape groove structure as a means for isolating the circuit elements. Also, the structure and the process of the production of an $I^2L$ memory cell described above can be applied not only to an $I^2L$ memory cell but also to semiconductor devices including the $I^2L$ memory cell.

What is claimed is:

1. A semiconductor memory device having plural elementary regions on a semiconductor substrate selectively isolated by V-shaped grooves, said semiconductor device comprising a first semiconductor layer of a first conductivity type formed over said substrate, an insulating layer selectively covering the surface of said first semiconductor layer, with predetermined portions of said insulating layer being enlarged in thickness, and respective ones of said predetermined portions essentially surrounding a central portion of each said elementary region, an injector region of the opposite conductivity type formed in said central portion of each said elementary region essentially under said insulating layer to be essentially surrounded by the respective thicker portions of said insulating layer of the elementary region, at least two regions of the opposite conductivity type in each elementary region, located selectively between said thicker portions of said insulating layer and said V-shaped grooves of the respective elementary region, and at least one region of the first conductivity type located in each one of said at least two regions of the opposite conductivity type, wherein said V-shaped grooves surround each said elementary region and include deep V-shaped grooves aligned in a first direction and shallow V-shaped grooves aligned transversely thereto, said deep V-shaped grooves extending through said first semiconductor layer, and said shallow V-shaped grooves terminating before reaching said substrate, so that selected corresponding portions in adjacent pairs of said elementary regions in said first direction are isolated while other selected corresponding portions of adjacent pairs of said elementary regions in the transverse direction are commonly connected as a result of said termination of said shallow V-shaped grooves, and where the bottom of said thick oxide portions are below the top surface of the adjoining semiconductor regions, and wherein each said elementary region includes a pair of vertical bipolar transistors comprising respective ones of said at least two regions of opposite conductivity type and the respective at least one region of the first conductivity type in each said region of the opposite conductivity type.

2. The device of claim 1 wherein said semiconductor device comprises said substrate being of said opposite conductivity type, and a second semiconductor layer of the first conductivity type formed between said first semiconductor layer and said insulating layer.

3. The device of claim 1 or 2 wherein said semiconductor substrate is of p type conductivity.

4. The device of claim 3 wherein said first and second layers are of n type conductivity.

5. The device of claim 1 or 2 wherein said insulating layer is made of silicon dioxide.

6. The device of claim 1 or 2 wherein each said elementary region comprises an integrated injection logic memory cell, and each said pair of vertical bipolar transistors essentially surround the respective injector region, wherein the base of each said vertical bipolar transistor is connected to the collector of the other vertical bipolar transistor of the same memory cell.

7. The device of claim 6 wherein the connections between the bases and collectors of said pair of transistors in each said memory cell comprise a first wiring layer.

8. The device of claim 7 comprising a respective digit line connected to each said collector of said pair of transistors of respective ones of said integrated injection logic memory cells.

9. The device of claim 8, each said digit line comprising a second wiring layer.

10. The device of claim 8 comprising a plurality of first word lines selectivity connecting said integrated injection logic memory cells, each said first word line comprising a conducting material connected to the respective injector regions of said memory cells, and a plurality of second word lines each comprising respective portions of said first semiconductor layer of the first conductivity type divided by said V-shaped grooves.

11. The device of claim 10, each said first word line comprising a third wiring layer.

12. The device of claim 9 comprising an insulating layer formed on the surface of the first wiring layer to insulate said first and second wiring layers.

13. The device of claim 10, wherein the neighboring memory cells connected in common to one of said first word lines are isolated by a V-shape groove which penetrate into said first semiconductor layer of the opposite conductivity type.

14. The device of claim 10 each of said memory cells that are commonly connected to a respective one of said first word lines being isolated from the other neighboring memory cells connected to the same first word line by a selected ones of said V-shaped grooves penetrating from the surface of the second layer of the opposite conductivity type into the semiconductor substrate.

15. The device of claim 1 or 2, each said injector region being centrally located in each said elementary region and each said pair of bipolar transistors in each said elementary region having a symmetric configuration about the respective injector region.

* * * * *

UNITED STATES PATENT AND TRADEMARK OFFICE
CERTIFICATE OF CORRECTION

PATENT NO. : 4,375,645
DATED : 1 March 1983
INVENTOR(S) : Tsuneo Funatsu

It is certified that error appears in the above-identified patent and that said Letters Patent is hereby corrected as shown below:

Front Page, [54] title should be --SEMICONDUCTOR DEVICE--;

Front Page, [73] Assignee, "Kanagawa" should be --Kawasaki--.

Column 1, line 31, "a,p" should be --a p--;
          line 33, "region" should be --regions--;
          line 51, delete "As";
          line 52, delete entire line.
Column 2, line 22, "an the" should be --and the--.
Column 3, line 67, "constitutent" should be --constituent--.
Column 4, line 7, "$n^{30}$" should be --$n^+$--;
          line 59, after "impurities" insert --,--.
Column 6, line 6, "housing" should be --having--;
          line 7, delete "opposite".
Column 7, line 17, delete "and";
          line 18, "where" should be --wherein--.

Signed and Sealed this

Thirtieth Day of August 1983

[SEAL]

Attest:

GERALD J. MOSSINGHOFF

Attesting Officer     Commissioner of Patents and Trademarks